(12) United States Patent
Park

(10) Patent No.: US 9,126,858 B2
(45) Date of Patent: Sep. 8, 2015

(54) METHOD FOR MAKING GLASS SUBSTRATE FOR DISPLAY, GLASS SUBSTRATE AND DISPLAY PANEL

(71) Applicant: AvanStrate Inc., Yokkaichi-shi, Mie (JP)

(72) Inventor: Young Tae Park, Nagoya (JP)

(73) Assignee: AvanStrate Inc., Yokkaichi-shi, Mie (JP)

( * ) Notice: Subject to any disclaimer, the term of this patent is extended or adjusted under 35 U.S.C. 154(b) by 0 days.

(21) Appl. No.: 13/871,522

(22) Filed: Apr. 26, 2013

(65) Prior Publication Data

US 2013/0306995 A1    Nov. 21, 2013

Related U.S. Application Data

(60) Provisional application No. 61/639,559, filed on Apr. 27, 2012.

(30) Foreign Application Priority Data

Oct. 31, 2012   (KR) .......................... 10-2012-0121948

(51) Int. Cl.

| | |
|---|---|
| H01L 29/04 | (2006.01) |
| C03C 3/091 | (2006.01) |
| H01L 21/48 | (2006.01) |
| C03C 15/00 | (2006.01) |
| H01L 33/08 | (2010.01) |

(52) U.S. Cl.
CPC ................ C03C 3/091 (2013.01); C03C 15/00 (2013.01); H01L 21/4803 (2013.01); H01L 33/08 (2013.01); *C03C 2204/08* (2013.01); *Y10T 428/24355* (2015.01)

(58) Field of Classification Search
CPC . H01L 27/32; H01L 21/4803; H01L 21/0203; C03C 15/00

USPC ............ 257/59, 72, 88; 216/67; 438/706, 48, 438/479
See application file for complete search history.

(56) References Cited

U.S. PATENT DOCUMENTS

| 5,618,448 A * | 4/1997 | Kuroe et al. .................... 216/97 |
| 2002/0012160 A1 | 1/2002 | Kase et al. |
| 2010/0079695 A1 * | 4/2010 | Um et al. ........................ 349/43 |
| 2013/0052414 A1 * | 2/2013 | Dobbins et al. .............. 428/141 |

FOREIGN PATENT DOCUMENTS

| JP | 2002-72922 A | 3/2002 |
| JP | 2007-322630 A | 12/2007 |
| JP | 2009-64950 A | 3/2009 |
| JP | 2010-275167 A | 12/2010 |
| WO | 2010/128673 A1 | 11/2010 |

OTHER PUBLICATIONS

Office Action issued in corresponding Japanese Patent Application No. 2013-061800 dated Dec. 3, 2013.

* cited by examiner

*Primary Examiner* — Tu-Tu Ho

(74) *Attorney, Agent, or Firm* — Sughrue Mion, PLLC

(57) ABSTRACT

A method for manufacturing a glass substrate for a display includes a step of producing a glass substrate and a step of performing a surface treatment on one glass surface of major surfaces of the glass substrate to form surface unevenness. The surface treatment is performed such that protruded portions having a height of 1 nm or more from the surface roughness central plane of the surface unevenness are dispersedly provided on the glass surface after the surface treatment and the area ratio of the protruded portions with respect to the area of the glass surface is 0.5-10%. Using this glass substrate, semiconductor elements are formed on a major surface of the glass substrate opposite to the glass surface. Accordingly, a display panel is produced.

7 Claims, 10 Drawing Sheets

Ra₁

Ra₂(>Ra₁)

METHOD FOR MAKING GLASS SUBSTRATE FOR DISPLAY, GLASS SUBSTRATE AND DISPLAY PANEL

BACKGROUND OF THE INVENTION

1. Field of the Invention

The present invention relates to a method for manufacturing a glass substrate for a display that is used for flat panel displays such as a liquid crystal display, a plasma display, an organic EL display and the like as well as a glass substrate and a display panel.

2. Related Background Art

Conventionally, in the manufacture of a flat panel display employing a liquid crystal display panel, a plasma display panel, an organic EL display panel or the like as a display panel, a fine thin film pattern is formed on a glass substrate by photolithography with use of an exposure device.

Display panels used for these flat panel displays are manufactured through various processes such as conveyance of a glass substrate, film formation, photolithography, etching, doping, wiring, or the like after the glass substrate is introduced to a manufacture line. In each process, panels including glass substrates are placed in an environment in which panels can be easily electrified due to various factors. For example, when the glass substrate is introduced to the manufacture line, slip sheets are peeled away and removed from the glass substrate when taking out glass substrates one by one from a plurality of the glass substrates that have slip sheets sandwiched therebetween and are layered on each other. At this time, the glass substrates are easily electrified at the time of removing the slip sheets. Also, in the case where a device for manufacturing a semiconductor is used in order to form a film and the like, the glass substrate is placed on a placement table to form the film. At this time, electrification due to an air current, a contact electrification, or a peeling electrification is likely to occur on the glass substrate. The peeling electrification is electrification that occurs in the case where the glass substrate that is in close contact with the placement table is removed from the placement table.

Such electrification causes various problems, and therefore it is preferable that the glass substrate is not electrified as much as possible. For example, in the case where a thin film transistor (TFT) and a wiring pattern are formed on the glass substrate, the wiring pattern may be damaged or may peel away due to foreign substances such as motes and dust adhering to the glass substrate or the wiring pattern due to electrification. Also, there is the case where the TFT or the like is damaged due to electric discharge of accumulated electric charges. Also, there is the case where the glass substrate adheres to the placement table due to the abovementioned electrification, and there is also the case where the glass substrate is cracked when it is removed from the placement table.

A method for removing electricity from the electrified glass substrate using an ionizer under such situations is known (JP 2009-64950A). Also, an exposure device that has a stage on which a substrate to be processed (glass substrate) is placed and that has a surface of 1-100 μm surface roughness is known (JP 2007-322630A).

In contrast to this, a glass substrate for a display that is capable of suppressing electrification when the glass substrates in a contact state are subjected to a peeling process are known (JP 2002-72922A). Specifically, the glass substrate is a glass substrate for a display that has a plate thickness of 0.3-6 mm, and an average value of $W_{CA}$ (filtered center line waviness) of 0.03-0.5 μm that is measured, in a measurement length of 200 mm, with a stylus type surface-roughness measuring instrument that uses a phase compensation 2RC bandpass filter having a cutoff value of 0.8-25 mm. It is assumed that the glass substrate is capable of reducing a contact area between the glass substrate and the placement table and also suppressing the electrification.

Furthermore, it is known that the glass surface is chemically processed so as to have an arithmetic mean roughness Ra of 0.3-1.5 nm (JP 2010-275167A). Specifically, it is assumed that the contact area between the glass substrate and the placement table can be reduced by setting the arithmetic mean roughness Ra of the glass substrate to 0.3-1.5 nm, and as a result, the amount of electrification can be reduced.

SUMMARY OF THE INVENTION

However, there is the case where even if the abovementioned average value of $W_{CA}$ (filtered center line waviness) is set to 0.03-0.5 μm or the glass surface is chemically processed so as to have an arithmetic mean roughness Ra of 0.3-1.5 nm in order to form surface unevenness on the glass surface of the glass substrate, effects of preventing electrification cannot be sufficiently obtained. In particular, with regard to a glass substrate on which an oxide semiconductor or a low-temperature polysilicon semiconductor is to be formed, for example, for a high definition and high resolution display that is used with a wiring pattern having a narrow line width and pitch, quality requirements for a glass substrate for a high definition and high resolution display have not been sufficiently met with controls using the conventional parameters. For example, with a glass substrate for a high definition and high resolution display, if a small defect occurs only on a wiring pattern to be formed thereon, such a glass substrate is considered to be unsuitable for a display. Also, there is a problem that if a line width of a wiring pattern or a pitch interval of a wiring pattern is narrow, electrostatic breakdown of a semiconductor element is likely to occur due to electric discharge caused from electrification, even with low level electric discharge, for example.

In view of this, it is an object of the present invention to provide a method for manufacturing a glass substrate for a display that is capable of suppressing electrification at the time of movement or conveyance of the glass substrate, and that is capable of making the occurrence of electrification difficult at the time of removing the glass substrate from a placement table when the placement table is in contact with the glass substrate in a device for manufacturing a semiconductor, and to provide the glass substrate and a display panel using this glass substrate.

One aspect of the present invention is a method for manufacturing a glass substrate for a display on which semiconductor elements are to be formed. The manufacturing method includes the steps of producing a glass substrate, and performing surface treatment on one glass surface of major surfaces of the glass substrate to form surface unevenness. The surface treatment is performed such that protruded portions having a height of 1 nm or more from a surface roughness central plane of the surface unevenness are dispersedly provided on the glass surface after the surface treatment and the area ratio of the protruded portions with respect to the area of the glass surface is 0.5-10%.

It is preferable that at this time, Rz of the surface unevenness (Rz is the maximum height of surface unevenness measured by an atomic force microscope) is 2 (nm) or more. More preferably, the Rz is 3 nm or more.

Also, it is preferable that the area ratio is 0.75-7.0%, and it is more preferable that the area ratio is 1.2-4.0%.

Also, it is preferable that the surface treatment is a dry etching process using plasma.

Also, it is preferable that the glass substrate is a glass substrate for forming semiconductor elements. Particularly, it is preferable that a major surface of the glass substrate for forming semiconductor elements that is opposite to said glass surface is a face on which a low-temperature polysilicon semiconductor or an oxide semiconductor is to be formed.

One aspect of the present invention is a glass substrate. Protruded portions having a height of 1 nm or more from a surface roughness central plane of surface unevenness are dispersedly provided on one glass surface of major surfaces of the glass substrate. The area ratio of the protruded portions with respect to the area of the glass surface is 0.5-10%, and another glass surface of major surfaces of the glass substrate opposite to said glass surface is to be used as a device face.

It is preferable that semiconductor elements are to be formed on said another glass surface of the glass substrate. It is preferable that at this time, said another glass surface is a face on which a low-temperature polysilicon semiconductor or an oxide semiconductor is to be formed. Also, thin film transistors including gate insulating films having a film thickness of less than 20 µm are to be formed on said another glass surface.

One aspect of the present invention is a display panel on which semiconductor elements are formed on a glass substrate. The glass substrate for the display panel includes a first major surface and a second major surface. The first major surface is a glass surface on which protruded portions having a height of 1 nm or more from a surface roughness central plane of surface unevenness are dispersedly provided and in which the area ratio of the protruded portions with respect to the area of the glass surface is 0.5-10%. The second major surface is opposite to the first major surface and the semiconductor elements are formed thereon.

According to a method for manufacturing a glass substrate for a display, the glass substrate, and a display panel of the above-described aspects, it is possible to suppress electrification at the time of movement and conveyance of glass substrates. Also, in a device for manufacturing a semiconductor, it is possible to make the occurrence of electrification difficult at the time of removing a glass substrate from a placement table when the placement table is in contact with the glass substrate. Also, electrostatic breakdown of a semiconductor element formed on a display panel can be suppressed.

DETAILED DESCRIPTION OF THE INVENTION

Hereinafter, a method for manufacturing a glass substrate for a display, a glass substrate and a display panel of the present invention will be described in detail based on the present embodiment.

The surface unevenness of a glass surface of the present invention refers to surface unevenness that is measured in a non-contact mode in a state in which an atomic force microscope (a model XE-100 manufactured by ParkSystems) is appropriately calibrated. Also, in the measurement, the atomic force microscope is adjusted in order to measure surfaces having low roughness such as surfaces having an arithmetic mean roughness Ra of less than 1 nm.

Measurement conditions are as follows:
Scan area: 1 µm square;
Scan rate: 0.8 Hz;
Servo gain: 1.5;
Sampling: 256 points×256 points; and
Set point: Automatic setting (manually setting is possible).

Figure 1:
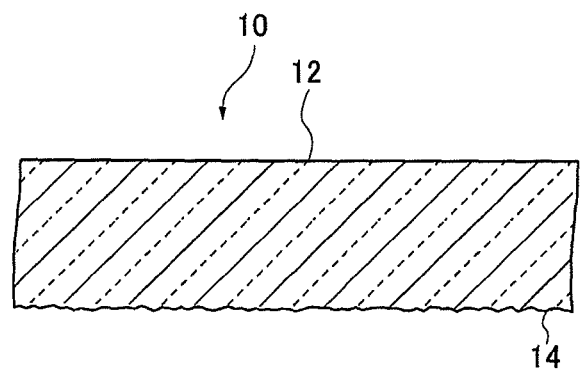
FIG. 1 is a cross-sectional view of a glass substrate of the present embodiment.

FIG. 1 is a cross-sectional view of a glass substrate 10 that is manufactured by a method for manufacturing a glass substrate for a display of the present embodiment.

The glass substrate 10 is used as a flat panel display such as a liquid crystal display panel, a plasma display panel, an organic EL display panel or the like. Furthermore, the glass substrate 10 can be used as a glass substrate for a solar cell panel. For example, the glass substrate 10 is a glass substrate having a thickness of 0.1-0.8 mm and a size of 550 mm×650 mm to 2200 mm×2500 mm. After a glass substrate is manufactured, semiconductor elements are formed on a major surface of the glass substrate. One glass surface 12 of the glass substrate 10 is a face on which semiconductor elements such as TFTs or the like are to be formed (semiconductor element formation face), and is a semiconductor element formation face on which a plurality of layered thin films such as low-temperature polysilicon thin films and indium tin oxide (ITO) thin films are to be formed (a face on which a low-temperature polysilicon semiconductor or an oxide semiconductor is to be formed). Some TFTs may include a gate insulating film having a film thickness of, for example, less than 20 µm. With a high definition and high resolution display panel, the gate insulating film is formed to have a thickness of, for example, 5 µm or more and less than 20 µm. Also, with a TFT including a gate insulating film having such film thickness, besides the gate insulating film, each layer that forms semiconductor elements is formed to be thin. Therefore, Ra (arithmetic mean roughness: JIS B 0601: 2001) of the glass surface 12 is reduced to be 0.2 (nm) or less, and therefore the glass surface 12 is an extremely smooth face.

On the other hand, a glass surface 14 that faces the glass surface 12 and is on the opposite side to the glass surface 12 is a face that is subjected to a surface roughening treatment, namely etching. Specifically, protruded portions having a height of 1 nm or more from the surface roughness central plane of the surface unevenness of the glass surface 14 are dispersedly provided, and the area ratio of the protruded portions with respect to the entire area of the glass surface 14 is 0.5-10%. Note that in the present embodiment, the surface unevenness is formed by an etching process, but the present invention is not limited to an etching process. Any surface treatments that are capable of forming surface unevenness can be used. Besides the etching process, examples of suitable surface treatments include physical polishing such as tape polishing, brush polishing, abrasive polishing, chemical mechanical polishing (CMP), or the like.

Figure 2A:
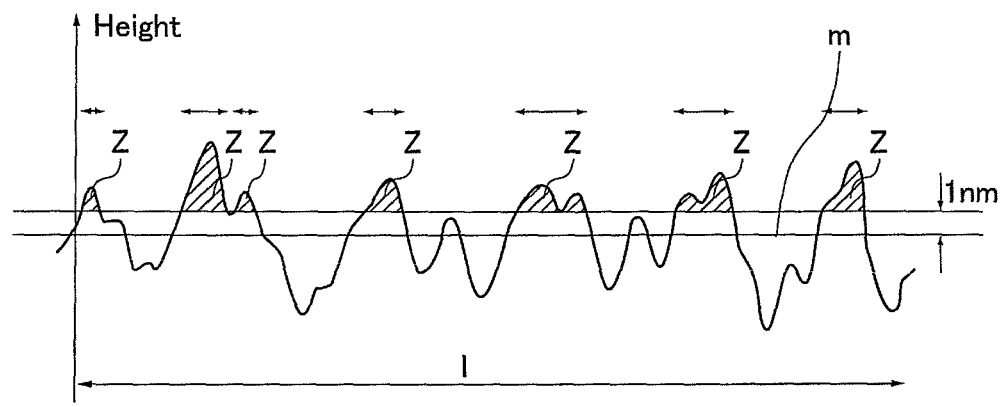
FIG. 2A is a graph illustrating a region of a protruded portion having a height of 1 nm or more from the central plane of the surface roughness of a glass surface.
Figure 2B:
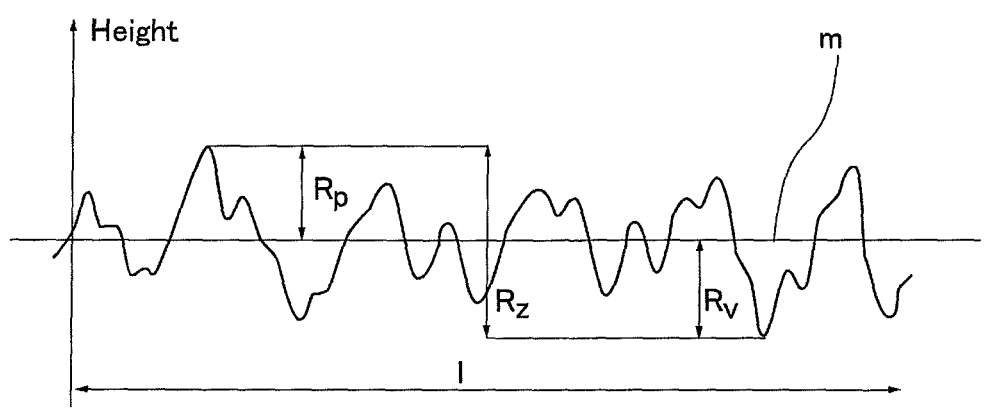
FIG. 2B is a graph illustrating Rz.

FIG. 2A is a graph one-dimensionally illustrating a region of protruded portions having a height of 1 nm or more from the central plane of the surface roughness of the glass surface 14 formed on the glass surface 14, and FIG. 2B is a graph one-dimensionally illustrating Rz. In FIGS. 2A and 2B, the shape of a surface profile is represented in one-dimensional display, and the central plane of the surface roughness is indicated by an average reference line m.

In FIG. 2A, the regions of the protruded portions (shaded regions) having a height of 1 nm or more from the central plane of the surface roughness of the glass surface (corresponding to the average reference line m in the graph) is indicated by regions Z. Here, the central plane of the surface roughness of the glass surface refers to a plane that is located at a position at which the sum (integrated value) is equal to 0, the sum being obtained by summing up (or integrating) the height (positive in higher height, and negative in lower height) at each position of the surface profile shapes (two-dimensional surface profile shapes) when the central plane is set to a height reference.

Also, Rz refers to the sum of Rp and Rv, that is, Rp+Rv, where the maximum peak height with respect to the surface roughness central plane of the surface unevenness of the glass surface 14 (the average reference line m, in FIGS. 2A and 2B) is defined as Rp, and the maximum valley depth is defined as Rv. Note that Rz is defined in JIS B 0601:2001.

A method for measuring area ratio will now be described using FIGS. 3A to 3D.

Figure 3A:
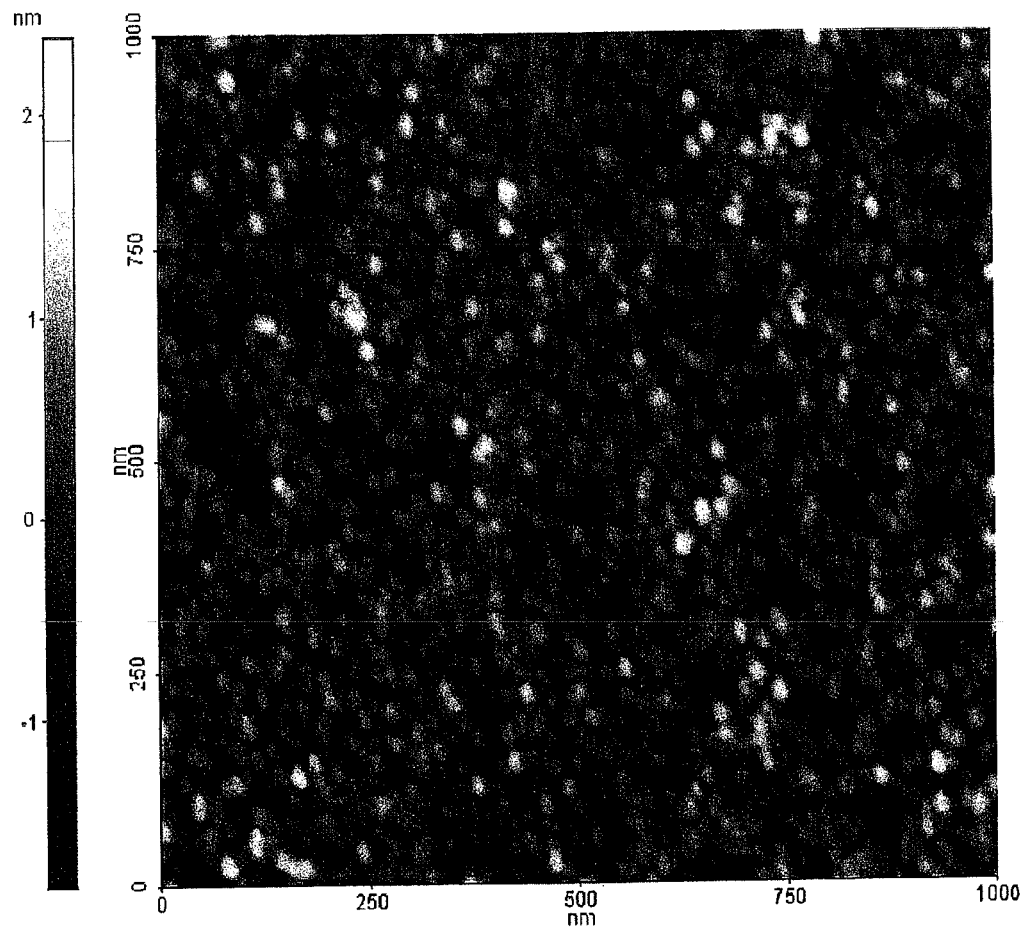
FIG. 3A is a diagram showing an example of the shape of a surface profile of a glass substrate that was measured using an atomic force microscope and a histogram of the surface unevenness.
Figure 3B:
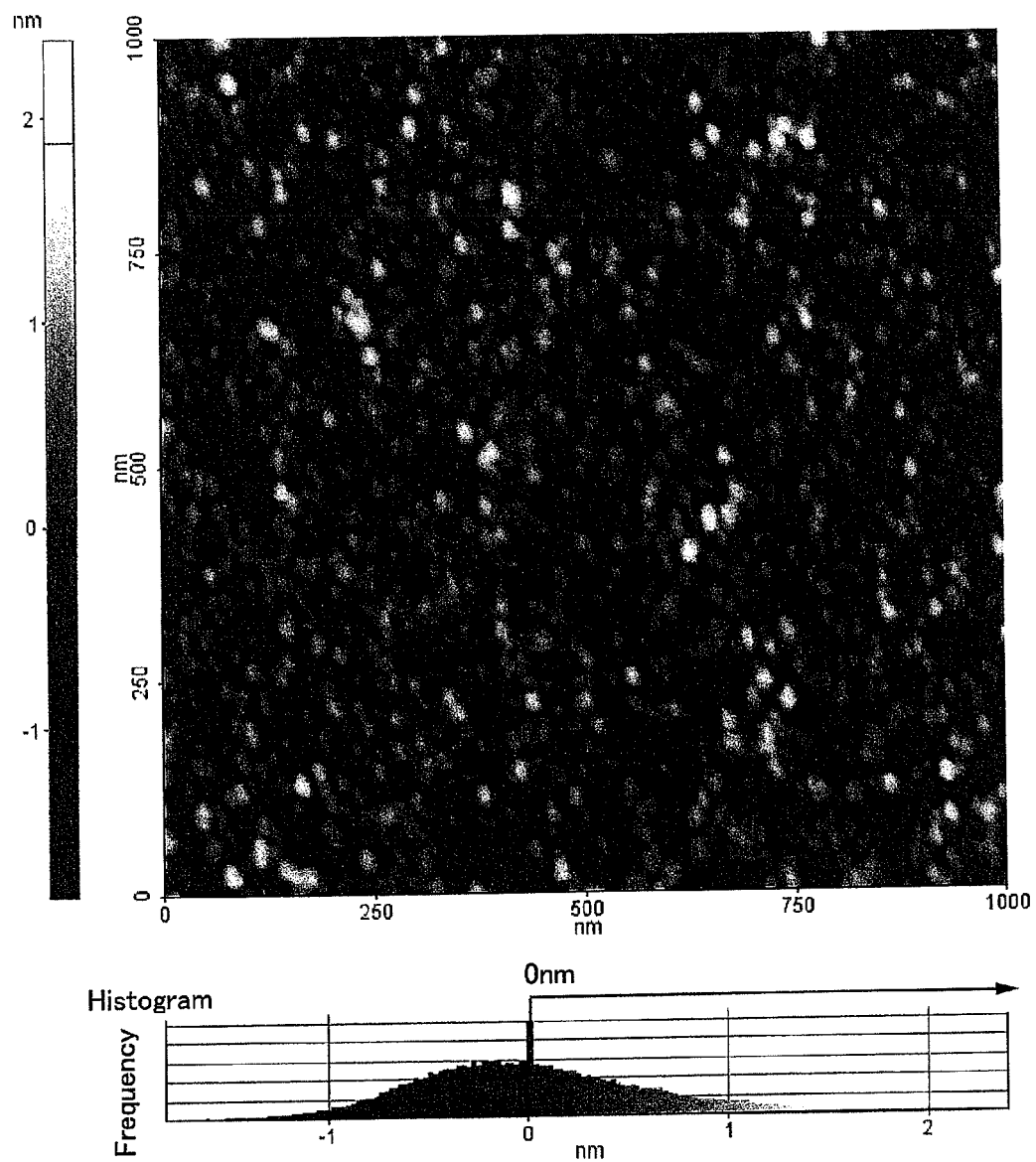
FIG. 3B is a diagram showing the distribution and the histogram of protruded portions having a height of 0 nm or more in the distribution shown in FIG. 3A.
Figure 3C:
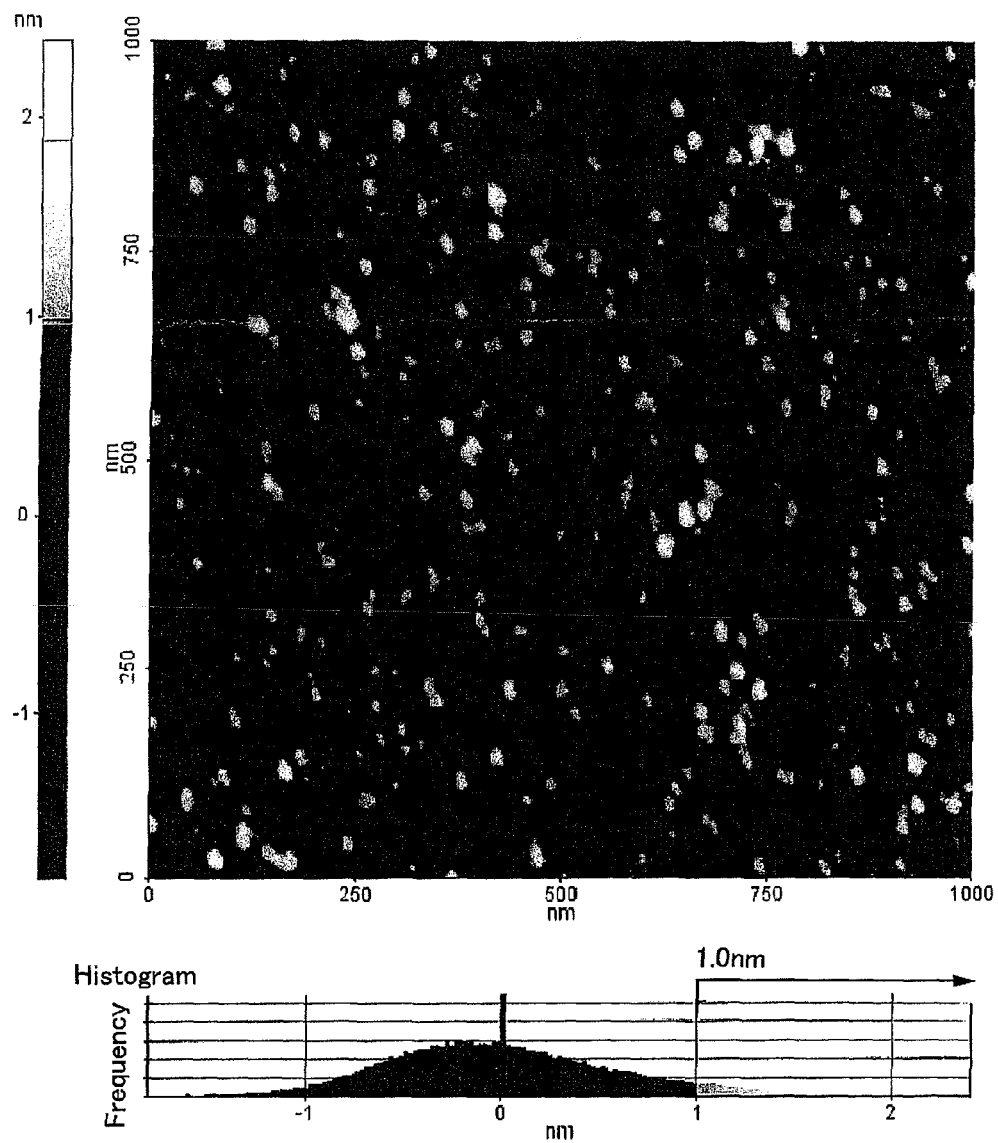
FIG. 3C is a diagram showing the distribution and the histogram of protruded portions having a height of 1 nm or more in the distribution shown in FIG. 3A.
Figure 3D:
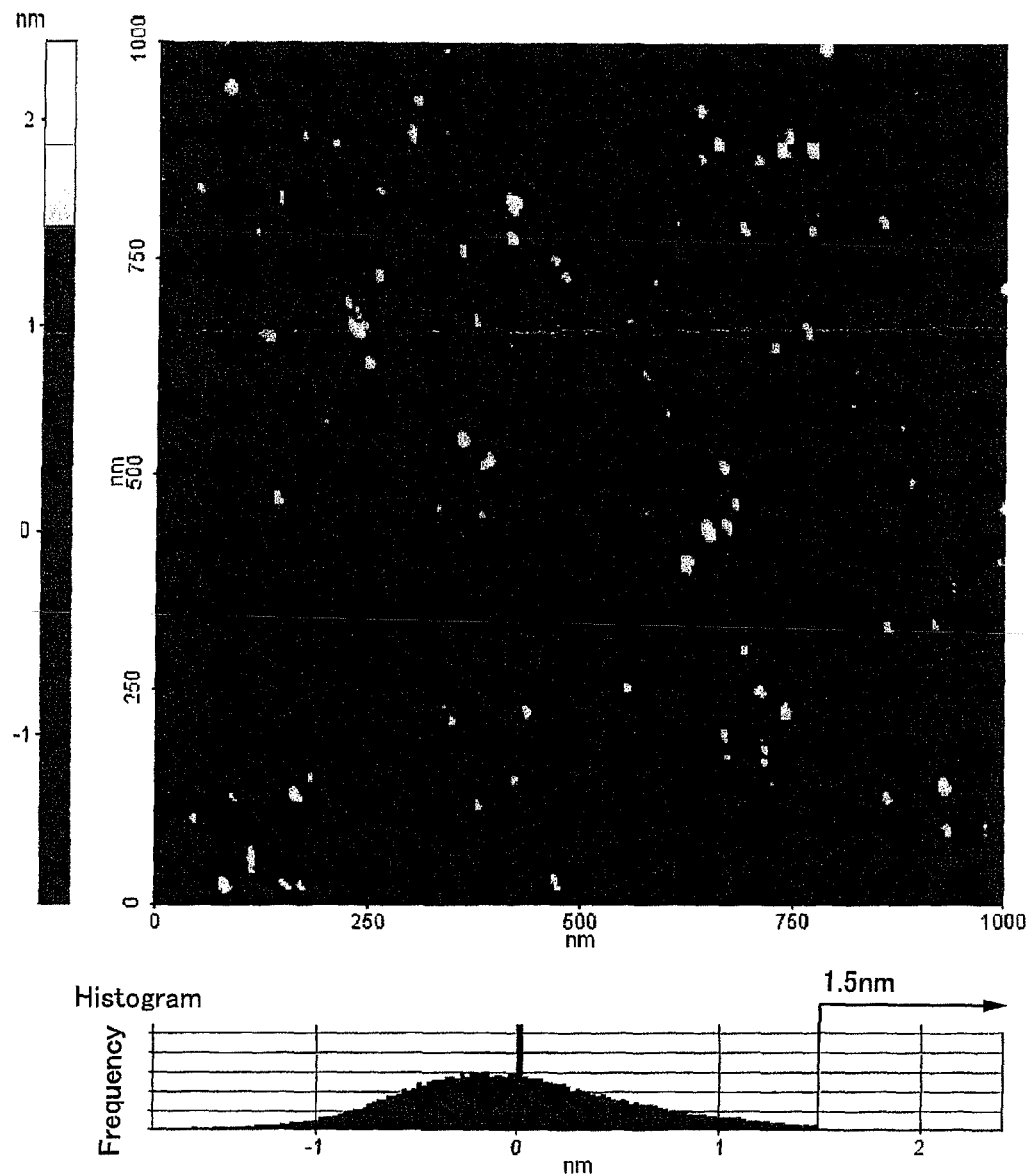
FIG. 3D is a diagram showing the distribution and the histogram of protruded portions having a height of 1.5 nm or more in the distribution shown in FIG. 3A.

FIG. 3A is a diagram showing an example of the surface profile shape having a size of 1 μm×1 μm (256 points×256 points) measured using the abovementioned atomic force microscope and a histogram of the surface unevenness. The position of a height of 0 is a position of the central plane of the surface roughness of the glass surface. FIGS. 3B to 3D respectively show the distributions and the histograms of dispersed protruded portions having a height of 0 nm or more, 1 nm or more, and 1.5 nm or more from the central plane of the surface roughness of the glass surface. In FIGS. 3B to 3D, the protruded portions having a height of 0 nm or more, the protruded portions having a height of 1.0 nm or more, and the protruded portions having a height of 1.5 nm or more are respectively indicated by white regions. Areas of protruded portions having a height of 0 nm or more, 1 nm or more and 1.5 nm or more are respectively determined by performing slicing at a height of 0 nm, 1 nm and 1.5 nm in the calculated histograms and counting the number of pixels at a height of 0 nm or more, 1 nm or more and 1.5 nm or more in the images.

With the glass substrate of the present embodiment, the area ratio of the protruded portions included in the entire region of the glass surface 14 having a height of 1 nm or more represented by white regions shown in FIG. 3C with respect to the entire region of the glass surface 14 is in a range of 0.5-10%. In FIG. 3D, it is understood that the white regions are less than 0.5% and there are less regions of the protruded portions having a height of 1.5 nm or more.

The reasons why the area ratio of the protruded portions having a height of 1 nm or more with respect to the area of the glass surface 14 is set to 0.5-10% as described above are given below. It is said that the movement of electric charges occurs if the distance between objects, the distance between a glass substrate and a support body such as a placement table or the like is no more than a given value, for example, 1 nm or less, or about 0.2-0.8 nm.

For this reason, the present inventors have focused on protruded portions having a height of 1 nm or more from the surface roughness central plane of the surface unevenness of the glass surface 14. Then, they have found that it is effective that the area ratio of the protruded portions having a height of 1 nm or more with respect to the area of the glass surface 14 is 0.5% or more in terms of preventing electrification from occurring. It is conceivable that in the case where the area ratio is less than 0.5%, when a glass substrate is placed on a placement table, or the glass substrate is placed on and becomes drawn to the placement table, each of protruded portions is not capable of supporting the glass substrate between surrounding portion of each protruded portion of the surface unevenness of the glass substrate and the surface of the placement table, and thus not capable of keeping a sufficient distance between the glass substrate and the surface of the placement table, resulting in electrification. On the other hand, in the case where the area ratio exceeds 10%, the maximum amount of electrification is increased because the area of contact portions between the abovementioned protruded portions and the placement table is increased. Also, in the case where etching is performed so that the area ratio exceeds 10%, the surface quality cannot be ensured because it is difficult to adjust the surface unevenness of the glass surface 14 as intended, and thus a scar defect easily occurs on the glass surface 14. For example, there is a possibility that a latent small scar is magnified by a surface treatment, resulting in a scar defect. Therefore, the abovementioned area ratio is 0.5-10%, the abovementioned area ratio is preferably 0.75-7.0%, and more preferably 1.2-4.0%.

Meanwhile, it is preferable that Rz is 2 nm or more, in terms of suppression of electrification. It is more preferable that Rz is 3 nm or more, in terms of suppression of electrification. However, if Rz exceeds a predetermined value, the surface mechanical strength of the glass substrate greatly decreases and also the surface unevenness is increased, and therefore the abovementioned scar defect easily occurs.

With the conventional glass substrate, Ra is set to 0.3-1.5 nm in order to suppress peeling electrification, but even if Ra is set to 0.3-1.5 nm, the area ratio of the abovementioned protruded portions with respect to the area of the glass surface in the present embodiment does not reach 0.5-10%. Also, even if the abovementioned area ratio is set to 0.5-10%, Ra does not necessarily reach 0.3-1.5 nm. In other words, Ra and the abovementioned area ratio are parameters that are independent of each other.

Figure 4A:
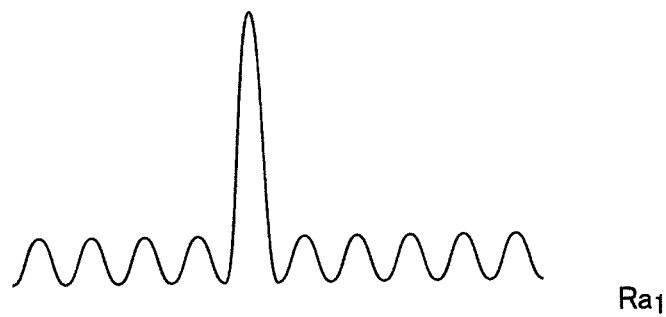
FIGS. 4A and 4B are diagrams showing examples of surface unevenness of a glass surface.
Figure 4B:
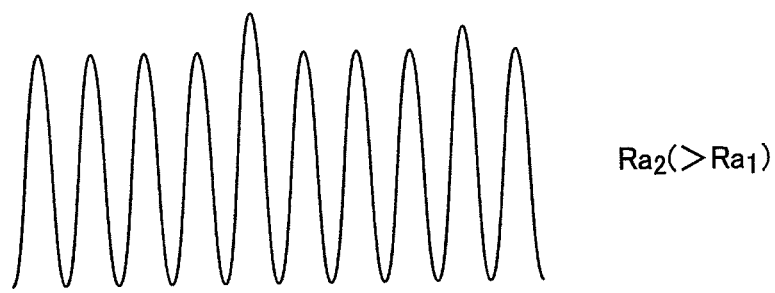

In the present embodiment, in order to suppress electrification or the amount of electrification of the glass substrate 10, the area ratio of the protruded portions having a height of 1 nm or more in the glass surface 14 is set to 0.5-10%. Thus, surface unevenness is formed to a great extent on the glass surface 14 by a surface roughening treatment. Therefore, in the case of suppressing the electrification or the amount of electrification of the glass substrate 10, it is conceivable that Ra of the glass surface 14 is generally increased due to the surface roughening treatment. However, Ra changes significantly depending on the distribution of the protruded portions of the surface unevenness formed on the glass surface 14. Two examples shown in FIGS. 4A and 4B are taken for example, in which the maximum heights of the protruded portions (the maximum protrusion heights from the surrounding recessed portions) are the same. The example shown in FIG. 4A is an example in which most of a plurality of protruded portions have substantially the same level of low height and only some of the protruded portions are much higher than the surrounding protruded portions. The example shown in FIG. 4B is an example in which almost all of the plurality of protruded portions have substantially the same height. In this case, the arithmetic mean roughness Ra satisfies $Ra_2>Ra_1$. In addition, because the example shown in FIG. 4A has a small area where the protruded portions make contact with the placement table, the example shown in FIG. 4A suppresses electrification or the amount of electrification of the glass substrate 10 more than the example shown in FIG. 4B. Therefore, according to the examples shown in FIGS. 4A and 4B, it is better for the glass surface 14 to have a small Ra in order to suppress the electrification or the amount of electrification. This point is contradictory to a general concept that the Ra of the glass surface 14 should be increased in order to suppress the electrification and the amount of electrification described above.

Thus, the Ra is not sufficient as an index for suppressing electrification or the amount of electrification of the glass substrate 10. In the present embodiment, taking this point into consideration, a surface roughening treatment is performed on the glass surface 14 such that the area ratio of the protruded portions having a height of 1 nm or more on the glass surface 14 is 0.5-10%.

With the glass substrate 10 of the present embodiment, electrification or the amount of electrification of the glass substrate is suppressed, and therefore the glass substrate 10 can be suitably used for a glass substrate on which a process such as a film formation process is performed using a device for manufacturing a semiconductor and also can be suitably used for a glass substrate for forming a color filter to which it is not desirable for motes and dust to adhere.

Also, the glass substrate 10 of the present embodiment is suitably used as a glass substrate which has above-described glass surface 12a where TFT is formed including a gate insulating film having a film thickness of less than 20 µm. With recent high definition and high resolution display panels, the film thickness of each layer, mainly an insulating film, included in a semiconductor element is decreased. As the background of this, there is a demand to decrease the thickness of a gate insulating film in order to fulfill a demand for reducing a pixel pitch and speeding up the switching of displays. Also, for power saving for display panels, the film thickness of the gate insulting film has been reduced because thin films allow the gate voltage to become low. As an example of such reduction in the film thickness in high definition and high resolution panels, the film thickness of the gate insulating film is reduced to less than 20 µm. In the past, the film thickness of the gate insulating film was about 70-100 µm, but it has recently decreased to 50 µm and further decreased to 20 µm. The reason why the gate insulating film can be thinned in this manner is because the film quality of gate insulating films has been improved, and therefore the film thickness can be decreased to meet the abovementioned demand. However, meanwhile, electric discharge occurs from the gate insulating film due to electrification of the glass substrate, and for example, the gate insulating film is damaged, resulting in the problem of electrostatic breakdown of a semiconductor element. In view of this, as a glass substrate that is to be used for a display panel on which a TFT whose gate insulating film is less than 20 µm thick is formed, it is particularly effective to use glass substrates in which the electrification or the amount of electrification is suppressed as above.

Display Panel

Display panels are produced by forming semiconductor elements on a major surface of such a glass substrate 10.

Specifically, the glass substrate 10 for display panels has a first major surface and a second major surface.

The first major surface is the abovementioned glass surface 14 on which protruded portions having a height of 1 nm or more from the surface roughness central plane of the surface unevenness are dispersedly provided, and the area ratio of the protruded portions with respect to the area of the glass surface 14 is 0.5-10%.

The second major surface is a face opposite to the first major surface (glass surface 14) and is the abovementioned glass surface 12, and semiconductor elements are formed thereon. For example, conductive thin films on which electrodes, wiring and the like are patterned or semiconductor elements are formed on the second major surface. Specifically, a display panel is formed on the second major surface through the formation of conductive thin films for electrodes and semiconductor thin films as well as photolithography steps for resist film formation, etching, resist removal and the like. In such a display panel, during steps of panel production, electrification or the amount of electrification of the glass substrate 10 is suppressed, and therefore electrostatic breakdown of a semiconductor element can be suppressed.

Particularly, in the case where a low-temperature polysilicon semiconductor or an oxide semiconductor is formed on the glass substrate 10, the thickness of the semiconductor element is thinner than in case of an amorphous silicon semiconductor conventionally used, a wiring width and a pitch interval to be connected to the semiconductor element are also decreased, and the pitch interval is decreased, for example, from 5 µm, to about 1.5-3 µm. Thus, there is a growing demand for preventing damage resulting from electrification, compared to the past. Thus, in the case where a low-temperature polysilicon semiconductor or an oxide semiconductor is formed on the glass substrate 10, the glass substrate 10 that is capable of suppressing the electrification and the amount of electrification has excellent effects.

Also, the glass substrate 10 is suitably used for a display panel on which a TFT including the above-described gate insulating film having a film thickness of less than 20 µm is formed. Although electric discharge is likely to occur in such gate insulating films having a reduced film thickness and such gate insulating films are easily damaged, electrification and the amount of electrification of the glass substrate is suppressed with use of the glass substrate 10, and therefore, electrostatic breakdown of such TFTs can be effectively suppressed. Therefore, while aiming to reduce the thickness of a thin film such as a gate insulating film, a high definition and high resolution display panel in which a problem resulting from electrification is suppressed is obtained.

Glass Composition

Glass containing the following components as a glass composition of the glass substrate 10 is given as an example.

(a) $SiO_2$: 50-70% by mass,
(b) $B_2O_3$: 5-18% by mass,
(c) $Al_2O_3$: 10-25% by mass,
(d) MgO: 0-10% by mass,
(e) CaO: 0-20% by mass,
(f) SrO: 0-20% by mass,
(o) BaO: 0-10% by mass,
(p) RO: 5-20% by mass (where R is at least one selected from the group consisting of Mg, Ca, Sr and Ba), (q) R'$_2$O: 0-2.0% by mass (where R' is at least one selected from the group consisting of Li, Na and K), and (r) 0.05-1.5% by mass in total of at least one metal oxide selected from the group consisting of tin oxide, iron oxide and cerium oxide.

Figure 5:
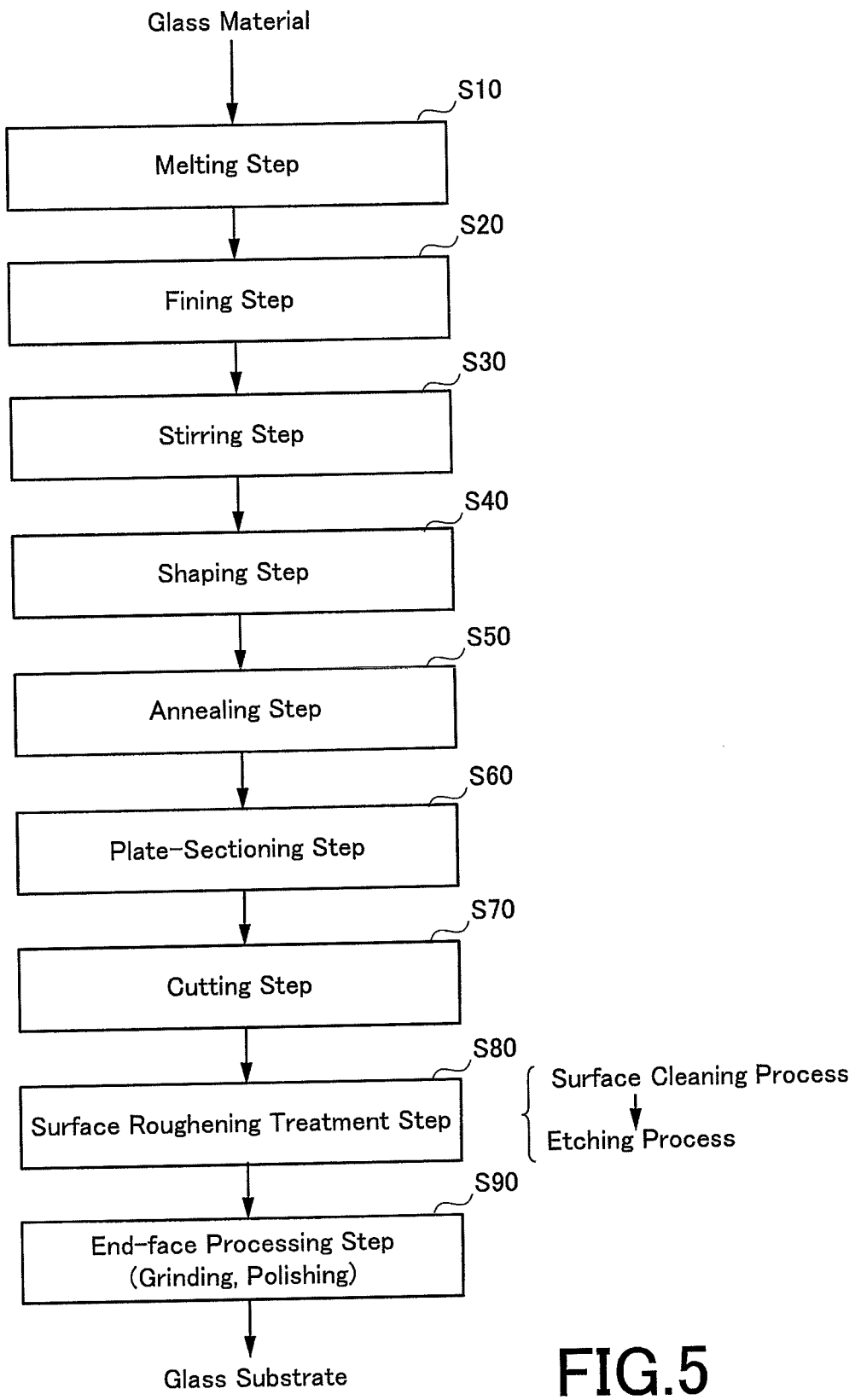
FIG. 5 is a flowchart of a method for manufacturing a glass substrate of the present embodiment.

Such a glass substrate 10 is manufactured using a down-draw process, a float process, or the like. Hereinafter, a manufacture method using a down-draw process is described. FIG. 5 illustrates an example of flowcharts of a method for manufacturing the glass substrate 10 of the present embodiment. A method for manufacturing a glass substrate for a display mainly includes a melting step (step S10), a fining step (step S20), a stirring step (step S30), a shaping step (step S40), an annealing step (step S50), a plate-sectioning step (step S60), a cutting step (step S70), a surface roughening treatment step (step S80), and an end-face processing step (step S90). The glass substrate 10 having a face on which semiconductor elements are to be formed is produced through the abovementioned melting step (step S10), the fining step (step S20), the stirring step (step S30), the shaping step (step S40), the annealing step (step S50), the plate-sectioning step (step S60), and the cutting step (step S70). Surface unevenness is formed, through the surface roughening treatment step performed thereafter, on the glass surface 14 opposite to a face on which semiconductor elements are to be formed among major surfaces of the glass substrate 10.

The melting step (step S10) is performed in a melting furnace. In the melting furnace, a glass material is introduced to a liquid surface of molten glass stored in the melting furnace, and is heated to prepare molten glass. Furthermore, the molten glass is allowed to flow from an outlet provided in one bottom portion of an internal side wall of the melting furnace toward a downstream step.

Heating the molten glass to melt a glass material in the melting furnace can be performed with help of the flame of a burner, in addition to a method for heating the molten glass with self-generated heat resulting from electricity flowing to the molten glass itself. Note that a fining agent is added to a glass material. Although SnO$_2$, As$_2$O$_3$, Sb$_2$O$_3$ and the like are known as a fining agent, the fining agent is not limited thereto. However, in view of reducing environmental load, it is preferable to use SnO$_2$ (tin oxide) as a fining agent.

The fining step (step S20) is performed at least in a fining tube. In the fining step, the temperature of the molten glass in the fining tube is increased, and thereby bubbles containing O$_2$, CO$_2$, or SO$_2$ contained in the molten glass absorb O$_2$ produced by a reduction reaction of the fining agent and grow, and the grown bubbles rise to the liquid surface of the molten glass and are then released. Furthermore, in the fining step, a reduced substance obtained by the reduction reaction of the fining agent undergoes an oxidation reaction by decreasing the temperature of the molten glass. Accordingly, gas components such as O$_2$ and the like in the bubbles remaining in the molten glass are re-absorbed by the molten glass and the bubbles disappear. The oxidation reaction and reduction reaction by the fining agent are performed by controlling the temperature of molten glass. Note that the fining step can be performed by using a vacuum degassing process in which a space of a reduced-pressure atmosphere is produced in a fining tube and bubbles present in molten glass are allowed to grow in the reduced-pressure for degassing.

Next, the stirring step is performed (step S30). In the stirring step, the molten glass is sent to a stirring tank (not shown) installed vertically in order to keep chemical and thermal uniformity of the glass. While the molten glass is being stirred by a stirrer provided in the stirring tank, it moves toward the bottom portion in the vertical-downward direction and is led to the subsequent step. Through this, non-uniformity of the glass such as striae and the like can be suppressed.

Next, the shaping step is performed (step S40). In the shaping step, a down-draw process is used. The down-draw process is a known method used in JP 2010-189220A and Japanese Patent No. 3586142, for example. Accordingly, a glass sheet having a predetermined thickness and a predetermined width is shaped. As a shaping method, although an overflow down-draw process is most preferable among down-draw processes, a slot down-draw process may be used.

Next, the annealing step is performed (step S50). Specifically, the shaped glass sheet is cooled to an annealing point or less than the annealing point in an annealing furnace (not shown) by controlling a cooling speed so as not to be distorted or warped.

Next, the plate-sectioning step is performed (step S60). Specifically, a glass sheet produced continuously is sectioned by a fixed length to obtain a glass substrate. Thereafter, in the cutting step (step S70), the glass substrate is cut into a predetermined size.

Next, a surface roughening treatment is performed (step S80). Specifically, a surface cleaning process is performed on the glass substrate and thereafter an etching process is performed.

In the surface cleaning process, an atmospheric-pressure plasma cleaning device (not shown) is used, and in the etching process, an etching device using atmospheric-pressure plasma is used, for example.

The atmospheric-pressure plasma cleaning device ejects plasma state gases using N$_2$ and O$_2$ onto the glass surface 14 (a face that makes contact with conveyance rollers) of the glass substrate 10 conveyed by conveyance rollers from a slit-like nozzle extending across the width of the glass substrate 10.

The atmospheric-pressure plasma cleaning device has a supply passage for N$_2$ and O$_2$, a pair of opposing electrodes provided halfway on both sides of the supply passage, and dielectrics that respectively cover the surfaces of the pair of opposing electrodes, and an end portion of the supply passage serves as a plasma irradiation hole and faces toward the glass substrate 10.

A thin film made of unnecessary organic compounds that adhere to the glass surface 14 are oxidized and removed by blowing gases (radicals) activated by such plasma onto the glass surface 14. The thin film made of organic compounds is removed to prevent the thin film made of organic compounds from functioning as a mask in the later-described etching process.

Thus, the glass surface 14 cleaned by plasma shows hydrophilicity because the organic compounds are removed. At this time, a contact angle of water with respect to the glass surface 14 is preferably 10 degrees or less, and more preferably 5 degrees or less. Such a preferable form can be achieved by adjusting a cleaning time period with activated gasses or a flow rate of gasses. In other words, it is preferable that as conditions for cleaning surface, the cleaning time period and the flow rate of activated gasses are adjusted so that the contact angle of water becomes 10 degrees or less.

Note that instead of cleaning using atmospheric-pressure plasma, a thin film made of organic compounds can be removed by ozone gas spraying or UV irradiation. It is sufficient for a thin film to be removed by oxidizing at least organic compounds or reforming a thin film made of organic compounds. Also, cleaning may be performed by applying a cleaning solution that is capable of removing organic compounds or a dipping treatment. However, it is preferable to perform cleaning with ozone gas spraying and UV irradiation in order to effectively perform the later-described dry etching.

Figure 6:
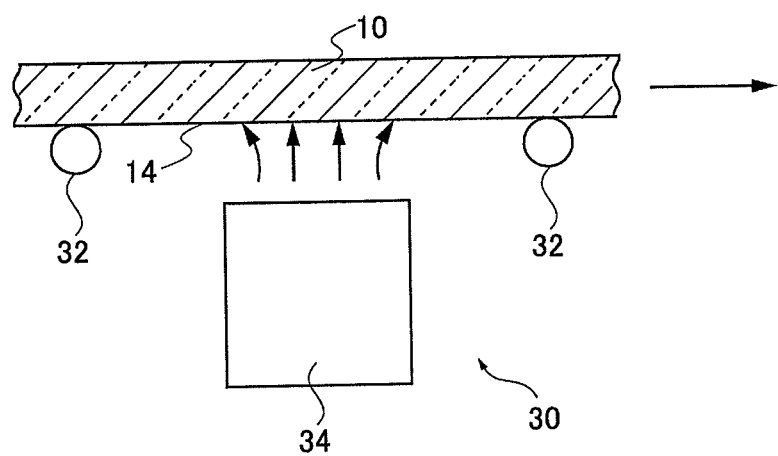
FIG. 6 is a diagram illustrating an example of an etching device used in the method shown in FIG. 5.

FIG. 6 is a diagram illustrating an example of an etching device that uses atmospheric-pressure plasma.

An etching device 30 that uses atmospheric-pressure plasma has an etching head 34 and a gas exhausting unit (not shown). The etching device 30 ejects etching gas onto one glass surface 14 (a face that makes contact with conveyance rollers 32) of the glass substrate conveyed by conveyance rollers 32 from a slit-like nozzle of the etching head 34 extending across the width of the glass substrate 10. The etching gas is gas containing an activated HF component that is produced by turning mixed gases of $CF_4$ and $H_2O$ into a plasma state. Accordingly, the glass surface is roughened by etching gas.

Note that protruded portions having a height of 1 nm or more from the surface roughness central plane of surface unevenness obtained after an etching process are dispersedly provided on the glass surface 14 of the glass substrate 10. The abovementioned etching process is performed such that the area ratio of the protruded portions with respect to the entire area of the glass surface 14 is 0.5-10%. Specifically, conditions for the surface roughening treatment (surface cleaning conditions and etching conditions) are set. For example, for etching conditions, a time period for etching is adjusted by adjusting the speed for conveying the glass substrate 10, or the flow rate of etching gas blown onto the glass surface 14, the type and the concentration of gas are adjusted.

Figure 7:
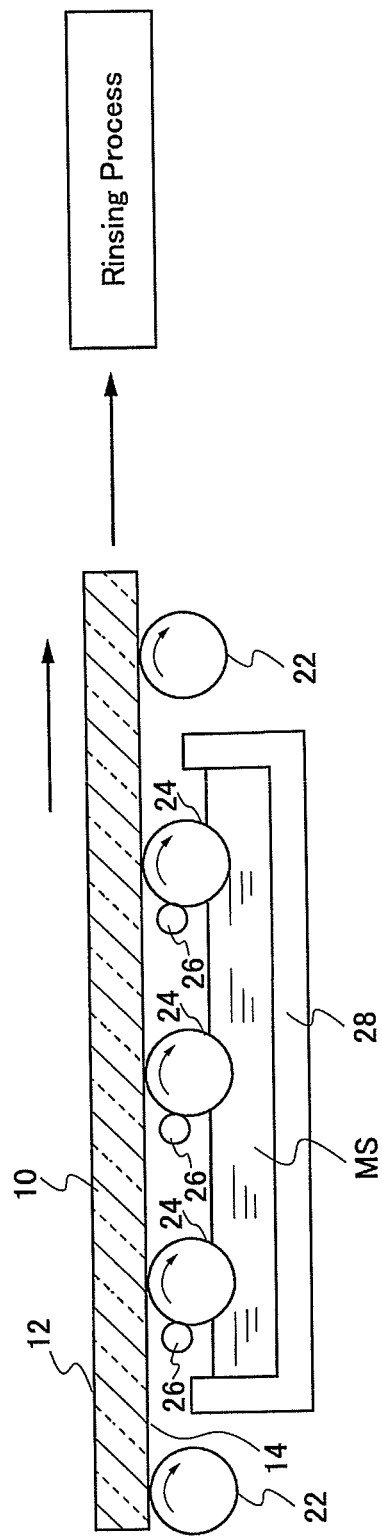
FIG. 7 is a diagram illustrating another example of an etching device used in the method shown in FIG. 5.

Note that an etching method for a surface roughening treatment is not limited to dry etching with etching gas, and wet etching that applies etchant on a glass surface to be subjected to a surface roughening treatment may be used. FIG. 7 is a diagram illustrating a method for performing a surface roughening treatment on the glass surface using etchant MS.

The etchant MS is stored in a container 28. Conveyance rollers 22 and conveyance application rollers 24 are provided between the glass substrate 10 and the container 28 so that while the glass substrate 10 is conveyed, the glass surface 14 makes contact with the etchant MS. An outer circumferential face of the conveyance application roller 24 is made of a sponge material. Also, a part of the outer circumferential face of the conveyance application roller 24 is soaked in the etchant MS. Therefore, the etchant MS is absorbed by the surface of the conveyance application roller 24. The etchant MS absorbed by the conveyance application roller 24 is applied to the glass surface 14 by making contact with the glass surface 14 of the glass substrate 10. At this time, part of the etchant MS absorbed by the conveyance application roller 24 is squeezed by a pressing force from a rotating contact roller 26 in order to adjust the application amount of the etchant MS to be applied to the glass substrate 10. That is, the contact roller 26 for applying a pressing force on the surface of the conveyance application roller 24 is provided in the device. Note that when a surface roughening treatment with the etchant MS is performed, besides such adjustment of application amount, the concentration of hydrofluoric acid used for the etchant MS and the etching time period may be adjusted. For example, the glass surface 14 is roughened into a desired shape by using a relatively highly concentrated hydrofluoric acid (4000-5000 ppm) and also adjusting the application amount and the etching time period.

With the device shown in FIG. 7, the application amount of the etchant MS applied to the glass surface 14 can be adjusted by adjusting the degree of pressing force that the contact roller 26 applies to the surface of the conveyance application roller 24. In other words, conditions for the etching process are adjusted such that protruded portions having a height of 1 nm or more from the surface roughness central plane of the surface unevenness are dispersedly provided on the glass surface 14 after the etching process, and that the area ratio of these protruded portions with respect to the area of the glass surface is 0.5-10%. A rinsing process with water or the like is performed on the glass substrate 10 that was subjected to the etching process with application of the etchant MS.

Through this, the surface roughening treatment step is performed by dry etching or wet etching. Instead of dry etching or wet etching, physical polishing such as tape polishing, brush polishing, abrasive polishing, chemical mechanical polishing (CMP) or the like may be performed.

After this step, the end-face processing step is performed (step S90). In the end-face processing step, grinding and polishing are performed on the end faces. In the end-face processing, a diamond wheel, a resin wheel or the like is used, for example.

Although the method for manufacturing a glass substrate for a display includes a washing step and an inspection step besides these steps, description thereof is omitted.

The glass substrate 10 obtained in this manner is conveyed to a panel manufacturer, and in the panel manufacturer, electrodes, wiring, or semiconductor elements and the like are formed on a major surface forming the glass surface 12 of the glass substrate 10 through the formation of conductive thin films for electrodes and semiconductor thin films as well as photolithography steps for resist film formation, etching, resist removal and the like, and then a display panel is produced. Note that instead of forming semiconductor elements or the like on the glass surface 12 of the glass substrate 10, color filters including a black matrix and RGB patterns may be formed on the glass surface 12 through a photolithography step.

As described above, the etching process is performed such that protruded portions having a height of 1 nm or more from the surface roughness central plane of the surface unevenness of the glass surface 14 subjected to the etching process are dispersedly provided on the glass substrate 10 and that the area ratio of these protruded portions with respect to the area of the glass surface is 0.5-10%, preferably 0.75-7.0%, more preferably 1.2-4.0%. Accordingly, even when the glass substrate is removed after the glass substrate has made contact with a placement table of a device for manufacturing a semiconductor, it is difficult for electrification to occur at the time of this contact and removal.

Particularly, it is preferable that Rz of the surface unevenness (Rz is the maximum height of the surface unevenness measured by an atomic force microscope) is 2 (nm) or more in terms of making the occurrence of electrification difficult.

Example of Experiment

A glass substrate for a liquid crystal display device using boro-aluminosilicate glass was produced in order to investigate the effects of the present embodiment.

Surface Roughening Treatment

The above-described atmospheric-pressure plasma cleaning was performed on the produced glass substrate. Specifically, a predetermined amount of mixed gas of $N_2$ and $O_2$ in a plasma state per minute was allowed to flow at a full width of the glass substrate to clean the glass surface of the glass substrate.

Furthermore, etching was performed using the etching device 30 shown in FIG. 6. In the etching device 30, radicals of etching gas HF obtained by allowing mixed gas of $CF_4$ and $H_2O$ to pass through plasma generated using noble gas or the like was allowed to flow at a full width of the glass substrate for etching.

Samples 1-8 shown in Table 1 below are examples in which surface unevenness to be formed by a surface roughening treatment is varied into various forms by changing the amount of $CF_4$ and $H_2O$ to be supplied, and the type of carrier gas ($N_2$ or Ar gas) to be added to the mixed gas of $CF_4$ and $H_2O$. A sample 0 is an example on which dry etching is performed not at all.

Surface Unevenness

Samples (length 50 mm and width 50 mm) were cut out from the produced glass substrate 10, and the surface unevenness of the glass surface 14 of the glass substrate 10 for each sample was measured using an atomic force microscope (model XE-100 manufactured by ParkSystems) in a non-contact mode. The device was adjusted in order to measure surface unevenness having a lower degree of surface roughness such as an arithmetic mean roughness Ra of less than 1 nm before the measurement. At the time of measurement, a scan area was set to 1 μm×1 μm (sampling number was 256 points×256 points) and a scan rate was set to 0.8 Hz. Also, servo gain in a non-contact mode of the atomic force microscope was set to 1.5. A set point was set to be automatical. Through this measurement, a two-dimensional surface profile shape relating to surface unevenness was obtained. Based on this surface profile shape, a histogram of surface unevenness was obtained, slicing was performed at a height of 1 nm from the central plane of the surface roughness, and the area of protruded portions was determined by counting the number of pixels at a height of 1 nm or more in images so as to determine the area ratios (%) of protruded portions. At the same time, Rz (nm) was determined.

Electrification Evaluation

Figure 8:
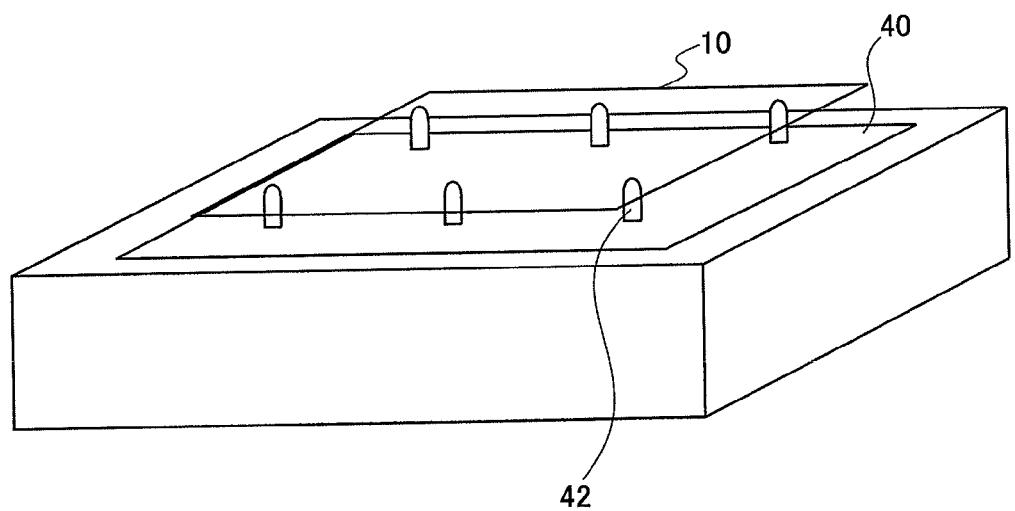
FIG. 8 is a diagram illustrating an electrification experiment that is performed in an example of experiments.

For evaluation of electrification of a glass substrate, the glass substrate 10 that has a size of 730 mm×920 mm and a thickness of 0.5 mm was used. As shown in FIG. 8, the glass substrate 10 was lowered and placed on a substrate table 40 by lowering lifting pins 42 with respect to a placement face of the substrate table 40 from a state in which the glass substrate 10 is placed on the substrate table 40 and is supported by the lifting pins 42. The substrate table has a surface obtained by performing an alumite treatment on an aluminum table.

Furthermore, after the glass substrate 10 was drawn by a suction device (not shown) at 50 kPa from a suction hole provided on the placement face of the substrate table 40, the suction was ended and the lifting pins 42 were raised. In this manner, a cycle of lowering, suction and ending suction of, and raising the glass substrate 10 was repeated a number of times until the amount of electrification was saturated. One cycle was set to 10 seconds. Also, the amount of electrification was measured per cycle. Measurement of electric potential of the glass surface at a central portion of glass was substituted for measurement of the amount of electrification.

For measurement, a surface electrometer (ZJ-SD, OMRON Corp.) was used. The height at which the surface electrometer was installed was set to 10 mm. An environment for measuring electrification was 23.5° C., and 74-75% in actual values measured by a thermohygrometer. From this measurement result, the maximum electric potential indicating the maximum amount of electrification and electrification speed were obtained. The measurement was performed by measuring the electric potential of a face of the glass substrate opposite to a face on the side of the substrate table.

The maximum electric potential is the electric potential obtained when the amount of electrification of the glass substrate 10 is saturated by repeating the abovementioned cycle a number of times until the amount of electrification is saturated. The electrification speed is represented by the number of cycles needed until an absolute value of electric potential exceeds 100 V. Note that the electric potential of the measured glass substrate surface was minus. In FIG. 1, the electric potential was shown using an absolute value.

Table 1 below represents an evaluation result of electrification speed and the maximum electric potential obtained when the area ratio of protruded portions formed by an etching process and having a height of 1 nm or more (height from the surface roughness central plane of surface unevenness) with respect to the entire area of the glass surface 14 and Rz were changed.

TABLE 1

|  | Sample 0 | Sample 1 | Sample 2 | Sample 3 | Sample 4 | Sample 5 | Sample 6 | Sample 7 | Sample 8 |
| --- | --- | --- | --- | --- | --- | --- | --- | --- | --- |
| Area Ratio (%) | 0.00 | 0.13 | 0.20 | 0.51 | 0.75 | 1.24 | 3.16 | 3.71 | 6.94 |
| Rz (nm) | 1.50 | 2.73 | 2.73 | 3.13 | 3.15 | 4.06 | 4.26 | 4.17 | 4.79 |
| Electrification Speed (number of cycles) | 5 | 9 | 6 | 10 | 13 | 12 | 22 | 25 | 31 |
| Max. Electric Potential (kV) | 18.1 | 17.5 | 18.7 | 16.9 | 16.2 | 15.1 | 13.0 | 12.7 | 16.2 |

Note that arithmetic mean roughness Ra of samples 1 and 2 was in the range of 0.3-1.5 nm but the area ratio was not in the range of 0.5-10% as shown in Table 1.

As clear from the evaluation result of Table 1, with samples 3-8, electrification speed (the number of cycles) exceeds 10 cycles (electrification speed is slow and is acceptable) and the absolute value of the maximum electric potential is less than 17 kV, and the area ratio of each sample was 0.5-10%.

Furthermore, it is understood that in the case where the area ratio is 0.75-7.0%, the maximum electric potential is lower than 16.2 kV (condition under which the amount of electrification is in an acceptable range) and an electrification problem does not arise. Samples 5-7 whose area ratios are in the range of 1.2-4.0% are more preferable in that the maximum electric potential is lower than 16 kV and the electrification speed is also slow. In other words, the area ratio of protruded portions is more preferably 1.2-4.0%.

Although a method for manufacturing a glass substrate for a display, a glass substrate, and a display panel were described above in detail, it is apparent that the present invention is not limited to the above-described embodiments and various modifications and changes may be made without departing from the scope and spirit of invention.

In particular, with regard to a glass substrate for, for example, forming oxide semiconductor or low-temperature polysilicon semiconductor elements for high definition and high resolution that is used with a wiring pattern having narrow line width and pitch, quality requirements for such a glass substrate have not been sufficiently met with controls using the conventional parameters. According to the present invention, an electrification problem can be suppressed in a glass substrate for a high definition and high resolution display on which wiring and electrodes having a narrow line width are to be formed and in which a small defect is not allowed to occur.

Also, it is possible to not only solve a problem resulting from electric discharge, but also increase yields of Cu-based electrodes and wiring having low adherence to glass by reducing the adherence amount of foreign substances to a glass substrate due to static electricity. In other words, a material for electrodes and wiring that has low adherence to glass can be used with use of the glass substrate of the present invention even if the line width is small. For example, it is possible to use a Cu-based electrode material such as Ti—Cu alloy that has lower adherence than Al-based electrodes, Cr electrodes, Mo electrodes, and the like but has low resistivity. It is possible to solve the problem of RC delay (wiring delay) that is likely to become a problem in a large-sized panel for television, because choices for selecting electrode materials are increased in this manner. Also, it is possible to provide a glass substrate that is capable of solving a problem of RC delay that may occur in a small-sized panel for a mobile terminal for which high-definition display is expected to be further advanced hereafter.

Also, although in the abovementioned description, an electrification problem was described using a glass substrate on which semiconductor elements are to be provided as a device, the present invention is also effective as a countermeasure against electrification in a glass substrate for a display on which a color filter or the like is to be formed as a device. For example, although line width of a black matrix (BM) is further reduced in a color filter (CF) panel, according to the present invention, detachment of BM caused by a foreign substance does not occur even in a liquid crystal display CF panel in which BM line width is 20 μm or less, i.e., in a liquid crystal panel in which BM line width is reduced to 5-10 μm.

DESCRIPTION OF REFERENCE NUMERALS

10 Glass Substrate
12, 14 Glass Surface
22 Conveyance Roller
24 Conveyance Application Roller
26 Contact Roller
28 Container
30 Etching Device
34 Etching Head
40 Substrate Table
42 Lifting Pin

What is claimed is:

1. A glass substrate, comprising:
   a first major surface of a glass substrate having a glass surface on which protruded portions having a height of 1 nm or more from a surface roughness central plane of surface unevenness are dispersedly provided and in which
      an area ratio of the protruded portions having the height of 1 nm or more with respect to an area of the glass surface is 0.5-10% and
      an area ratio of protruded portions having a height of 1.5 nm or more from the surface roughness central plane with respect to the area of the glass surface is 0.5% or less; and
   a second major surface of the glass substrate that is opposite to the first major surface;
   and a semiconductor element formed on the second major surface.

2. The glass substrate according to claim 1, further comprising a semiconductor element formed on the second major surface.

3. The glass substrate according to claim 2, wherein a low-temperature polysilicon semiconductor or an oxide semiconductor is formed on the second major surface as the semiconductor element.

4. The glass substrate according to claim 2, wherein thin film transistors including gate insulating films having a film thickness of less than 20 μm are formed on the second major surface as the semiconductor element.

5. The glass substrate according to claim 3, wherein thin film transistors including gate insulating films having a film thickness of less than 20 μm are formed on the second major surface as the semiconductor element.

6. The glass substrate according to claim 1, wherein Rz of the surface unevenness (Rz is a maximum height of the surface unevenness measured by an atomic force microscope) is 2 (nm) or more.

7. The glass substrate according to claim 1, wherein the area ratio is 0.75-7.0%.

* * * * *